United States Patent
Chen (10) Patent No.: US 6,971,076 B2
(45) Date of Patent: Nov. 29, 2005

(54) METHOD FOR ESTIMATING PEAK CROSSTALK NOISE BASED ON SEPARATE CROSSTALK MODEL

(75) Inventor: Pinhong Chen, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 4 days.

(21) Appl. No.: 10/313,866

(22) Filed: Dec. 5, 2002

(65) Prior Publication Data

US 2003/0115563 A1 Jun. 19, 2003

Related U.S. Application Data

(60) Provisional application No. 60/342,012, filed on Dec. 18, 2001.

(51) Int. Cl.[7] .............................. G06F 17/50
(52) U.S. Cl. .............. 716/4; 716/5; 716/6; 716/8; 716/11
(58) Field of Search .................. 716/4–6, 8, 11

(56) References Cited

U.S. PATENT DOCUMENTS

| | | | | |
|---|---|---|---|---|
| 5,555,506 A | * | 9/1996 | Petschauer et al. | 703/13 |
| 5,568,395 A | * | 10/1996 | Huang | 716/4 |
| 6,253,355 B1 | * | 6/2001 | Chadha et al. | 716/5 |
| 6,523,149 B1 | * | 2/2003 | Mehrotra et al. | 716/4 |

* cited by examiner

Primary Examiner—Vuthe Siek
(74) Attorney, Agent, or Firm—Daniel J. Bedell; Smith-Hill and Bedell (57) ABSTRACT

Crosstalk noise peaks in output signals of nets of an integrated circuit layout design are estimated by first processing the design to estimate resistances and capacitances of the nets. The design is then processed to identify each aggressor net having at least one section that is proximate to a section of a victim net. A separate aggressor model is then generated for each proximate aggressor net section, the aggressor model including a current source and a capacitor. The design is then processed to identify each victim net that is proximate any aggressor net and a separate crosstalk model is generated for each identified victim net. The crosstalk model for each victim net includes the victim net's estimated resistances and capacitances and incorporates the aggressor model of each aggressor net section that is proximate to a section of the identified victim net. The crosstalk model for each identified victim net is then evaluated to determine a response to a signal applied as input to the victim net of a victim net output signal. The peak crosstalk noise in each identified victim net is estimated based on the response of the net's output signal.

15 Claims, 5 Drawing Sheets

METHOD FOR ESTIMATING PEAK CROSSTALK NOISE BASED ON SEPARATE CROSSTALK MODEL

CROSS-REFERENCE TO RELATED APPLICATIONS

The present application claims the benefit of the filing date of copending U.S. Provisional Application No. 60/342,012 filed Dec. 18, 2001.

BACKGROUND OF THE INVENTION

1. Field of the Invention

The present invention relates in general to computer-aided design (CAD) tool for and in particular to a CAD tool method for calculating peak crosstalk noise in nets of an integrated circuit design.

2. Description of Related Art

Figure 1:
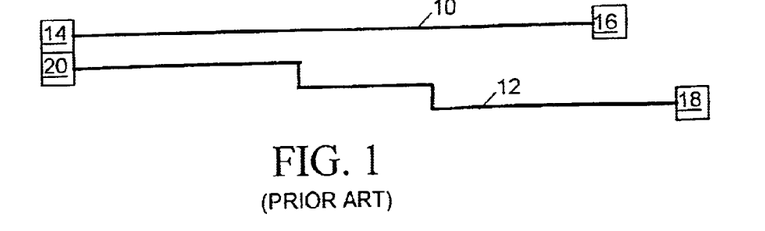
FIG. 1 is a simplified plan view of two prior art nets within an IC layout.

A typical integrated circuit (IC) includes circuit components ("cells") formed within a semiconductor substrate and conductors ("wires") residing between insulating layers above the substrate providing signal paths ("nets") between the circuit components. FIG. 1 is a simplified plan view of two simple nets 10 and 12. Net 10 links the output of a driver cell 14 to an input of a receiver cell 16 while net 12 links the output of a driver cell 18 to the output of a receiver cell 20. Based on a netlist description of the circuit referencing the cells that are to be included in a circuit and indicating how their terminals are to be interconnected, and based on a cell library description of the layout of each cell, a computer-aided placement and routing tool can automatically determine where to place each cell 14–20 within the semiconductor substrate and how to route signal paths forming nets 10 and 12 between the cells.

Some amount of coupling capacitance exists between each pair of nets in an IC, so that when a signal edge travels along any one net, the coupling capacitance causes transient charging currents to flow in every other net. The transient charging currents produce transient variations in voltages ("crosstalk noise") of the signals conveyed by the other nets. The peak magnitude of the crosstalk noise in each "victim" net capacitively coupled to an "aggressor" net conveying the signal edge is a function of such factors as the distance between sections of victim and aggressor nets that are near one another, the lengths of those sections of the victim and aggressor nets, the dielectric constant of the material separating them and relatively timing of the signals they convey. When the crosstalk noise is sufficiently large, it can temporarily drive a signal to a false logic state. Thus it is necessary for the designer to be able to identify nets that are subject to excessive levels of crosstalk noise so that the designer can reroute such nets to reduce crosstalk noise.

The development of deep-submicron technology has allowed IC designers to pack more functionality into ICs by shrinking cell sizes, wire widths and wire spacings. However in moving to deep-submicron technology problems associated with crosstalk noise arise more frequently because the reduced spacing between wires forming nets increases the crosstalk coupling capacitance between them. It is possible to accurately predict peak crosstalk noise but methods for doing so require substantially more computer processing time than less accurate methods for estimating peak crosstalk noise. Fast but relatively inaccurate methods for estimating peak crosstalk are known, but when a designer is able to only roughly estimate peak crosstalk noise, the designer must allow for a relatively large margin of error when deciding whether to reroute a net and will therefore reroute nets more frequently than necessary. This slows the IC development process and reduces the efficiency of the IC layout. Thus with respect to estimating peak crosstalk noise, the designer is faced with a tradeoff between processing time spent accurately estimating peak crosstalk nose and processing time spent rerouting nets.

Figure 2:
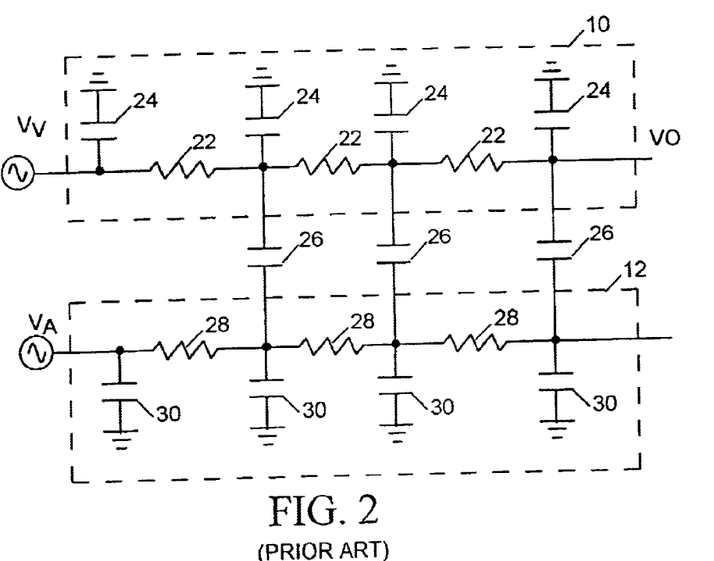
FIG. 2 is a schematic diagram depicting a prior art crosstalk model of the two nets of FIG. 1 including each net's series resistances, shunt capacitances and including coupling capacitances between the nets.

Crosstalk noise estimates are typically based on the path resistances and capacitances seen by signals passing through the nets. Computer-aided "RC extraction" tools analyze IC layouts to estimate the series resistance and shunt capacitance of various sections of each net. For example FIG. 2 is a schematic diagram modeling networks 10 and 12 of FIG. 1 and their coupling capacitance based on the kind of data provided by an RC extraction too. Resistors 22 and 28 model the series resistances of various sections of nets 10 and 12 and capacitors 24 and 30 model the shunt capacitances of each net section. Capacitors 26 model the coupling capacitance between various sections of nearby nets.

To determine the crosstalk noise in the output signal V0 of a victim net 10 resulting the signals conveyed in aggressor net 12, the designer can program a simulator to simulate the behavior of the circuit model depicted by FIG. 2 wherein signals $V_V$ and $V_A$ represent the output signals of drivers 14 and 20 of FIG. 1. The nature and relative timing of the $V_V$ and $V_A$ signal edges are predetermined, based on conventional static timing analysis of the circuit upstream of nets 10 and 12. After the simulator generates waveform data representing behavior of the output voltage $V_O$ of victim net 10, that waveform data can be analyzed to determine the amount of crosstalk noise in the VO signal.

The simulation method can predict peak crosstalk noise with relatively high accuracy, but the method can be very time-consuming when used to estimate peak crosstalk noise in every net in a large IC, since an IC can have many thousands of nets. Although the example victim/aggressor model of FIG. 2 is relatively simple in that each network 10 and 12 has only three separately modeled sections, a model of a victim may have many more than three sections and may include branches for delivering a signal from one driver to more than one receiver. Also while FIG. 2 takes into account coupling capacitance between only two networks, several aggressor networks can make significant contributions to crosstalk noise in any one victim network. Therefore a circuit model of a victim net and all aggressor nets substantially contributing to its crosstalk noise will often be much more complicated than the model depicted in FIG. 2, and a circuit simulator will have to spend a substantial amount of processing time carrying out the simulation for each net of an IC.

Figure 3:
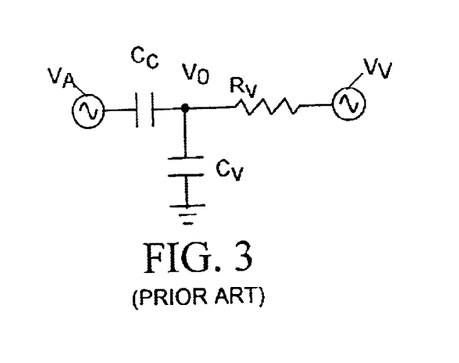
FIG. 3 is a schematic diagram depicting another prior art crosstalk model of the two nets of FIG. 1.

U.S. Pat. No. 5,568,395 issued Oct. 22, 1996 to Huang, reduces the time needed to estimate crosstalk noise in part by simplifying the model of victim net and its nearby aggressor nets. FIG. 3 represents a model of victim net 10 and aggressor net 12 of FIG. 1 as suggested by Huang. Capacitance $C_C$ represents the sum of coupling capacitances 26 (FIG. 2) between the two networks, $C_v$ represents the sum of shunt capacitances 24 of victim net 10, and $R_V$ represents to sum of series resistance 22 of victim net 10. The model of FIG. 3 ignores the series resistance 28 and shunt capacitance 24 of aggressor network 12.

Figure 4:
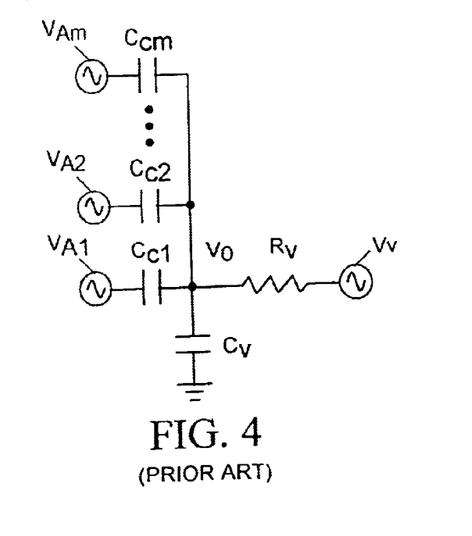
FIG. 4 is a schematic diagram depicting a prior art crosstalk model for a single victim net experiencing crosstalk noise caused by multiple aggressor nets.

The model of FIG. 3 can be easily expanded as illustrated in FIG. 4 when net 10 is the victim of m aggressor nets. A model having the topology of FIG. 4 can be constructed for every victim net of any IC, with appropriate values for the lumped resistance and capacitance parameters $C_{C1}$, $C_V$ and $R_V$ being derived from the RC extraction data for the victim and aggressor nets.

Huang teaches that, based on the model of FIG. 4, the peak crosstalk noise for any victim net of an IC can be estimated by evaluating a mathematical expression having the resistance and capacitance parameters of the model of FIG. 4 as independent variables. Since it is much quicker for a computer to evaluate the expression based on the model of FIG. 4 than to simulate circuit behavior of a model of the type illustrated in FIG. 2, Huang's approach significantly reduces the time needed to estimate crosstalk noise.

Figure 5:
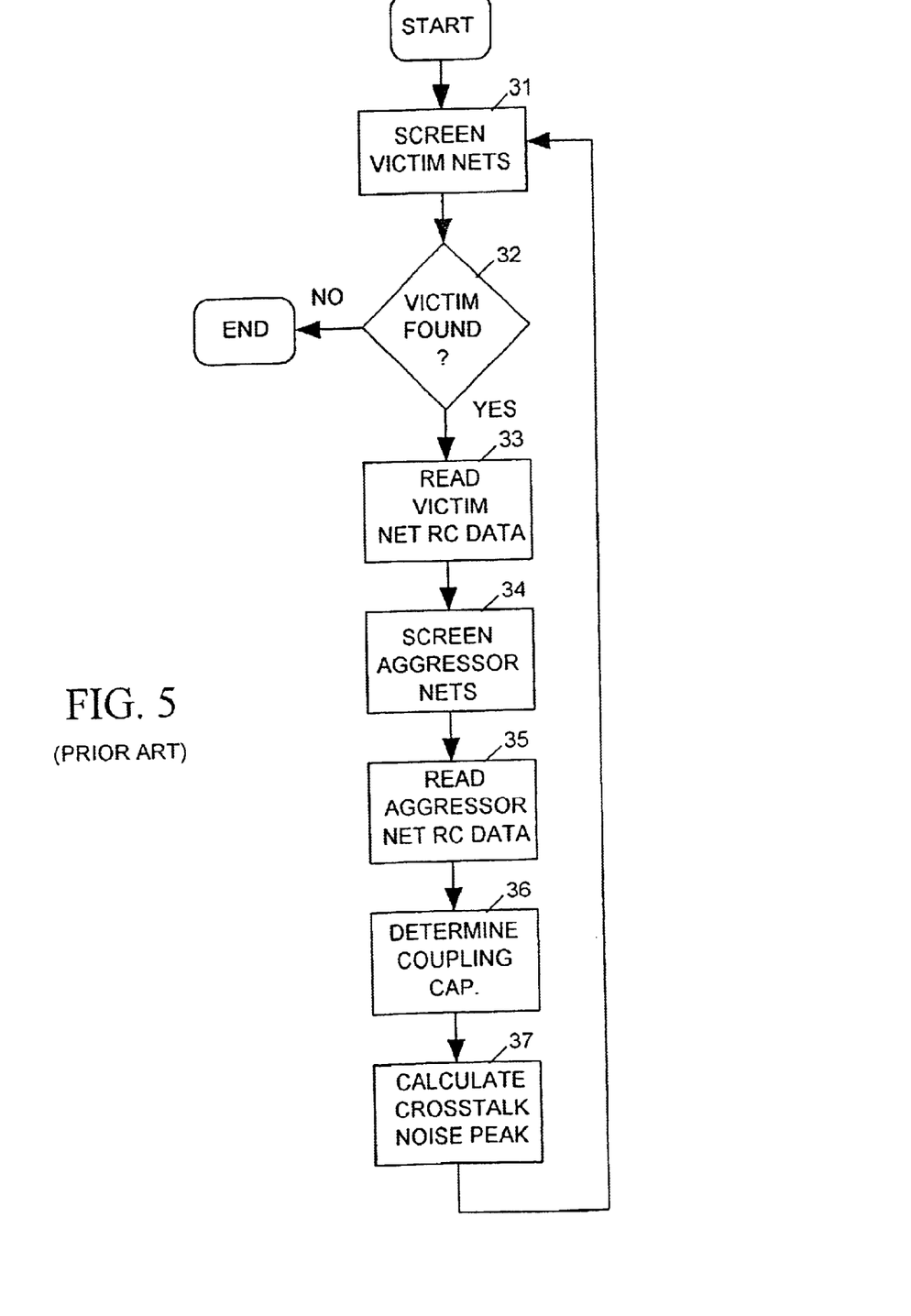
FIG. 5 is a process flow diagram depicting a prior art process for estimating peak crosstalk noise in victim nets employing the model of FIG. 4.

Huang also teaches to further reduce the time needed to estimate crosstalk noise in an IC by pre-screening the nets to eliminate nets are unlikely to have excessive crosstalk noise, and then calculating peak crosstalk noise only for the remaining nets. FIG. 5 illustrates a process flow suggested by Huang. Beginning at step 31, the nets are subjected to a screening process to select a first net of the IC as a victim net that could be subject to excessive crosstalk noise. During the screening process, the RC extraction data for each successive net is inspected to determine whether the net has a large loading capacitance or a short RC time constant. Huang teaches that signals conveyed by victim nets having large loading capacitances or short RC time constants are unlikely to be driven to false logic states by crosstalk noise and should be rejected as candidates for crosstalk noise calculations. When a suitable victim net is found (step 32), the RC extraction data is read into memory (step 33) and all of the other nets are then screened (step 34) to eliminate any nets that are unlikely to cause substantial crosstalk noise in that victim net. During the aggressor net screening process, the IC layout is analyzed to determine how distant each aggressor net is to the victim, and aggressor nets that are too distant from the victim are eliminated from consideration.

Having identified the aggressor nets that are sufficiently close to the selected victim net, the RC data for each identified aggressor net is read into memory (step 35). An RC extraction tool is then used to determine the coupling capacitances between each identified aggressor net and the victim net (step 36). The coupling capacitances, along with the RC data for the victim net, are then processed to calculate the peak crosstalk noise at the output of the victim net (step 37). The process repeatedly loops through steps 31–37 to calculate peak crosstalk noise for each net not eliminated by victim net screening step 31.

While Huang's approach reduces the time required to estimate crosstalk noise in the nets of an IC over methods employing circuit simulation, its crosstalk noise calculation is based on the simplified model of FIG. 4 that does not represent the behavior of the victim net output signal $V_O$ as accurately as the more complex model of FIG. 2.

Huang's process flow of FIG. 5 can be somewhat time-consuming because it may require a processor to repeatedly access a hard disk man times. A data file containing RC extraction database for a large, complicated IC is usually much too large to fit in the random access memory of a computer executing crosstalk calculation software. The computer must therefore store the RC extraction database file on a hard disk and read access that disk whenever it needs RC extraction data for any particular net. Since it takes a substantial amount of time for the computer to read access a disk drive, disk access time can be quite significant in comparison to the time the computer needs to compute peak crosstalk noise for the net. An inspection of the prior art process flow of FIG. 5 reveals that it may be necessary for computer carrying out the crosstalk analysis procedure to read access the RC data for any given net many times. The RC extraction data for a given net of the IC is read once during step 31 because the capacitance and resistance of the net are factors used in screening the nets to determine which nets are likely to be substantially influenced by crosstalk. The RC data for that net is then read again at step 33 when the net is identified as a victim for which crosstalk noise must be calculated because the RC characteristics of the net are used in the crosstalk calculation. The RC data for a net is read yet again at step 35 whenever that net is identified as an aggressor with respect to any victim net. Thus, for example, when a net is proximate to fifteen other nets, a computer carrying out the crosstalk calculation process could read access that net's RC data seventeen times, once during victim net screening step 31, once during step 33 after having been identified as a victim net, and once at step 35 for each of the other nets that are identified as its victim.

What is needed is a method for estimating crosstalk noise that is nearly as accurate those based on simulation of the model of FIG. 2, but which requires less computation time and relatively fewer disk accesses.

BRIEF SUMMARY OF THE INVENTION

The invention relates to a method for estimating peak crosstalk noise in nets of an integrated circuit (IC) described by an IC layout design. In accordance with the method, the layout design is initially processed to identify each aggressor net that is sufficiently close to a victim net that crosstalk noise in the victim net could be problematic and should therefore be estimated. Upon identifying an aggressor net, a separate aggressor model is generated for each section of the aggressor net that is proximate to a section of a victim net.

The model of each aggressor net section, based on RC extraction data characterizing aggressor net resistance and capacitance and on a simulated response of the entire aggressor net to an input signal edge passing through each aggressor net section, includes a capacitor and a current source supplying a current pulse to the capacitor. The capacitor of the aggressor model for each aggressor net section represents the shunt and coupling capacitance of that aggressor net section. The magnitude, duration and timing of the current pulse output of the current source of each aggressor net section model are chosen so that the voltage waveform developed across the capacitor in response to the current pulse approximates the shape of the input signal edge as it passes through the aggressor net section.

After an aggressor model for each aggressor net section that is proximate to a victim net is generated and stored in random access memory, the IC layout design is again processed to identify each victim net that is sufficiently proximate any aggressor net that crosstalk noise in the victim net could be problematic. A separate crosstalk model is generated for each identified victim net. The crosstalk model incorporates resistances and capacitances each section of the victim net derived from RC extraction data, and also incorporates the aggressor model of each aggressor net section that is proximate to any section of the identified victim net.

The crosstalk model for each identified victim net is simulated to determine a response of a victim net output signal to an edge of a signal applied as input to the victim net. The crosstalk noise in each identified victim net is estimated based on an analysis of the response of the net's output signal to the input signal edge.

The crosstalk estimation method in accordance with the invention requires a computer processor implementing the method to read access an RC extraction data file not more than two times for each net, once when the net is identified as an aggressor net, and once when the net is identified as a victim net.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The present invention is directed to a computer-based method for calculating peak crosstalk noise in a net of an integrated circuit (IC), and also to computer readable media storing software which when read and executed by a conventional computer causes the computer to carry out that method. Suitable computer-readable media for storing the software include, but are not limited to, compact disks, floppy disks, and hard disks. This specification describes one or more exemplary embodiments of the invention considered by the applicants to be best mode(s) of practicing the invention.

A "net" is a signal path residing in various semiconductor or metallic layers of an IC for linking an output of one gate to inputs of one or more other gates. An IC has such nets, and when sufficiently long sections of any two nets are sufficiently close to one another, coupling capacitance between those sections of the nets can cause a significant amount of crosstalk noise the signals they convey. Since crosstalk noise can temporarily drive a signal to an incorrect logic state, it is necessary when developing an IC layout design to route nets in a way that avoids excessive crosstalk noise. One way to do that is to simply route nets so that they are all separated by a minimum difference that guarantees crosstalk noise will be remain below maximum allowable levels, but that approach can waste space on an IC. The better approach is to allow placement and routing tools to initially route nets without paying much attention to crosstalk noise, to analyze the resulting IC layout to identify nets that are subject to excessive crosstalk noise, and to then reroute the identified nets so as to reduce their exposure to crosstalk noise.

The invention relates to a method for quickly and accurately estimating peak crosstalk noise in a signal conveyed by each "victim" net of the design resulting from signals conveyed by one or more nearby "aggressor" nets of the design. Such estimates enable a designer to determine which nets should be rerouted to reduce crosstalk noise.

Figure 6:
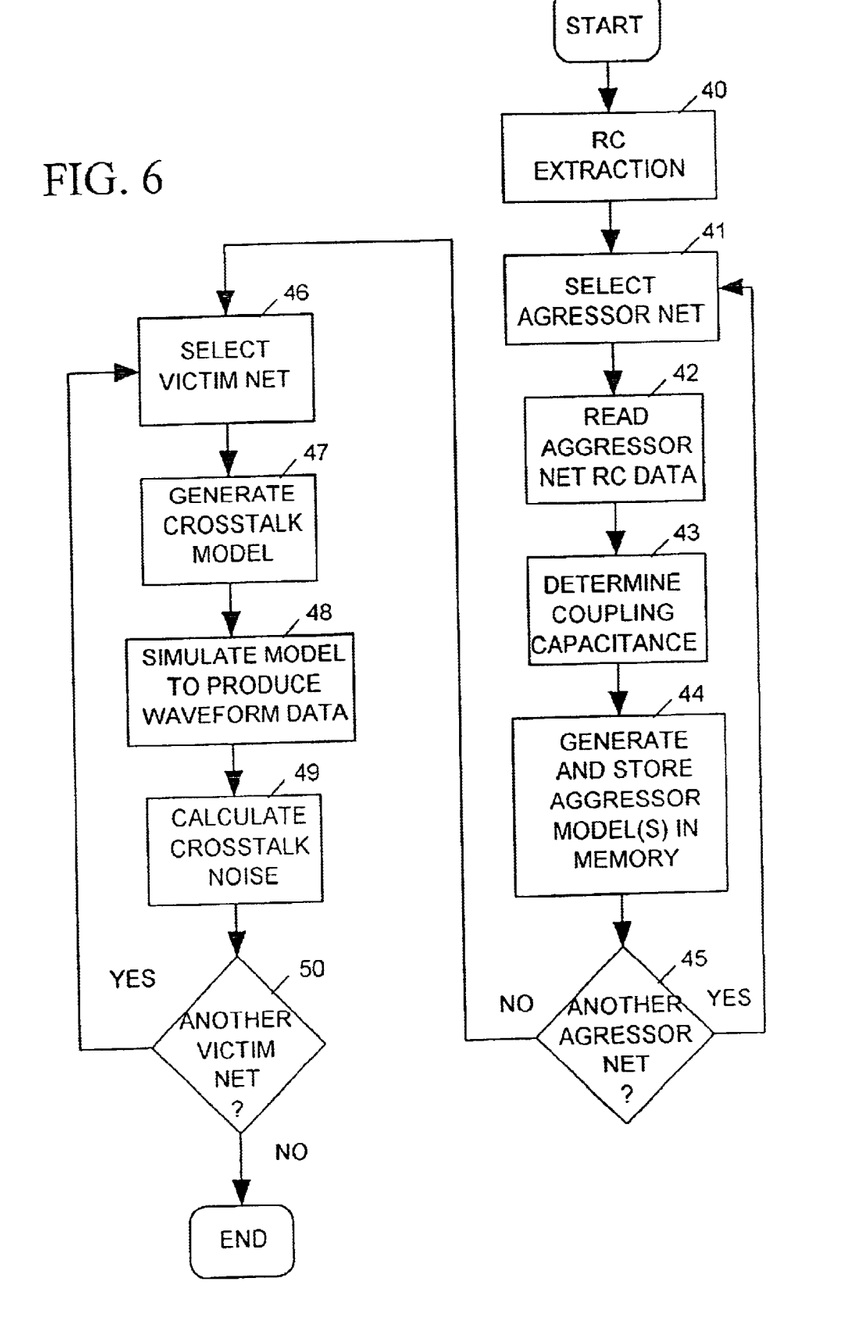
FIG. 6 is a process flow diagram depicting a process in accordance with the invention for estimating peak crosstalk noise in victim nets.

FIG. 6 is a process flow diagram depicting an exemplary embodiment of a crosstalk estimation method in accordance with the invention. The first step (step 40) is to process the layout using a conventional RC extraction tool to determine resistances and capacitances of the various sections of each net and to store that data in an RC extraction database. Except for very small ICs, the RC extraction database will be stored on a hard disk because it is too large to wholly reside in the random access memory of a conventional computer.

Next (step 41) the nets are screened to identify an aggressor net having sections sufficiently near any other net that it likely to be coupled to the other net through substantial coupling capacitance. since the aggressor net screening is based on an analysis of the IC layout to determine distances between nets, it is not necessary to access the RC extraction data for any net during the aggressor net screening process.

When an aggressor net is found to be sufficiently close to a least one victim net (step 42), the RC data for that aggressor net is read from the hard disk into random access memory (step 43). The coupling capacitances between each section of the aggressor net and sections of nearby victim nets are determined using a conventional RC extraction tool based on an analysis of the IC layout design (step 44). A model of each section of the aggressor net that is proximate to a section of a victim net is then generated and stored in random access memory (step 45). (Details of step 45 and the nature of the aggressor models generated at step 45 are discussed below.) The process of FIG. 6 continues to loop through steps 41–45 until a separate model has been created and stored in memory for each section of each aggressor net identified at step 41 as being proximate to at least one victim net.

The next step in the process is to screen the nets of the IC layout design to identify victim nets that may be subject to substantial crosstalk noise (step 46) due to their proximity to aggressor nets. Every net of an IC is to some extent a victim of every other net of the IC because there is at least a small amount of capacitance coupling each pair of nets which can pass transient currents between the nets, thereby causing some amount of crosstalk noise. However when two nets are far enough apart, the coupling capacitance between the two nets will be too small to produce significant crosstalk noise. In the victim screening process carried out at step 46, each net is reviewed in turn to determine whether the net has any sections sufficiently close to any other net that coupling capacitance will exceed a threshold value. If not, the net is rejected as being unlikely to be subject to substantial crosstalk noise. When a net is sufficiently close to other nets, the RC data for that net is read and processed to determine whether its shunt capacitance is sufficiently large or its RC time constant (the product of its shunt capacitance and series resistance) is sufficiently small that the net is unlikely to be substantially affected by crosstalk.

When a net is not eliminated at step 46 as being unlikely to be subject to substantial crosstalk noise, it is identified as a victim net. When a victim net is identified (step 47), a crosstalk model of the victim net is created (step 48) that incorporates the resistance and capacitance of each section of the net, based on the RC extraction data read into memory during victim net screening at step 46. The crosstalk model also incorporates one or more aggressor models, generated at step 45, of sections of aggressor nets that are closely coupled to sections of the victim net. The crosstalk model (described in detail below) is then supplied as input to a circuit simulator (step 49) which generates waveform data representing the behavior of the victim net's output signal (s). That waveform data is then analyzed to calculate the peak crosstalk noise in the net's output signal (step 50). The process repeatedly loops through steps 46–50 until each victim net has been identified at step 46, a crosstalk model for that victim net has been generated (step 48), the crosstalk model has been subjected to simulation (step 49), and the peak crosstalk noise for that net has been calculated (step 50).

As mentioned above, for a large IC, the RC extraction database file created at step 40 can be too large to reside wholly in the random access memory of a typical computer, so the file is suitably stored on a hard disk. The computer carrying out the peak crosstalk noise calculation process of FIG. 6 read accesses the RC extraction database when it requires RC extraction data relative to any given net. Each disk access can require a comparatively large amount of time, but the process flow of FIG. 6 screens the nets in a way the reduces the number of nets for which RC extraction data must be accessed, and otherwise limits the maximum number of times the computer needs to read access the RC extraction data for any one net to two.

The computer does not access RC extraction data during aggressor net screening (step 41) because the RC characteristics of the nets are not relevant to aggressor net screening. Thus the RC data for only those nets that are identified as aggressors are read at step 43. The RC extraction data for a net may also be read during victim net screening step 46, but only when the net is sufficiently close to any aggressor net. Thus when the net is sufficiently close to any other net, its RC extraction data is read only twice, once at step 43 prior to developing aggressor net models of various sections of net (step 46), and once again at step 46 prior to generating a crosstalk model of the net, after the net has been identified as victim (step 48).

Aggressor Models

Figure 7:
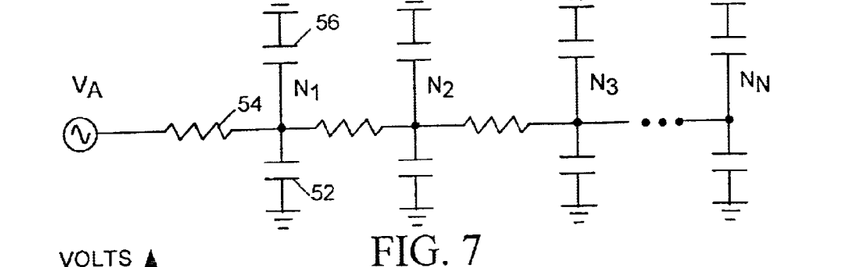
FIG. 7 is a schematic diagram depicting a model of an aggressor net employed during the crosstalk estimation process depicted by FIG. 6.

FIGS. 7–10 illustrate how at step 45 of FIG. 6 the a separate aggressor model is developed for each section of an aggressor net that is proximate to a section of a victim net. Based on RC extraction data for the aggressor net, a model of the entire aggressor net is initially created. For example as depicted in FIG. 7, the aggressor net model includes a capacitor 52 and a resistor 54 modeling the series resistance and shunt capacitance of each of N sections of the aggressor net derived from the RC extrication data. The model of FIG. 5 also includes an additional shunt capacitance 56 representing the coupling capacitance between each section of the aggressor net and any nearby victim net section as determined at step 44. Although the coupling capacitance actually couples the aggressor net to a victim net, the model of FIG. 7 instead treats coupling capacitance 56 as if it couples the aggressor net to ground. In the model of FIG. 7, the aggressor net is driven by a voltage $V_A$ that changes state at some time relative to a reference time 0 as determined by conventional static timing analysis.

Figure 8:
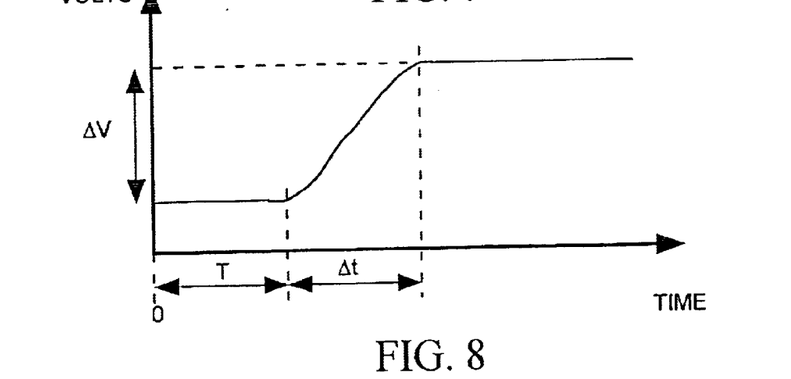
FIG. 8 is a timing diagram illustrating behavior of a signal appearing at a node of the model of FIG. 7.

Having established full aggressor net model of FIG. 7, the model is then subjected to simulation to generate waveform data depicting an example behavior of waveform appearing at an output node $N_1$, $N_2$, . . . $N_N$ of each section of the net in response to the $V_A$ signal. As the $V_A$ signal edge propagates down net from node-to-node, the signal edge delay and the rise time of the signal at any section output node $N_1$-$N_N$ is a function of the series resistances and shunt capacitances it encounters along the way. FIG. 8 depicts a typical waveform as might appear, for example, at node $N_1$. The state change in the waveform is delayed by a time T from reference time 0 and changes in voltage by an amount γV as it swings from low to high logic levels over a time γt in response to a positive-going edge of $V_A$. Generally similar waveforms appear at the other section output nodes $N_2$-$N_N$ though they will have differing delay times T and will have differing rise times γt. The waveform data at each node may be directly calculated using conventional circuit analysis techniques as an alternative to using a simulator for that purpose.

Figure 9:
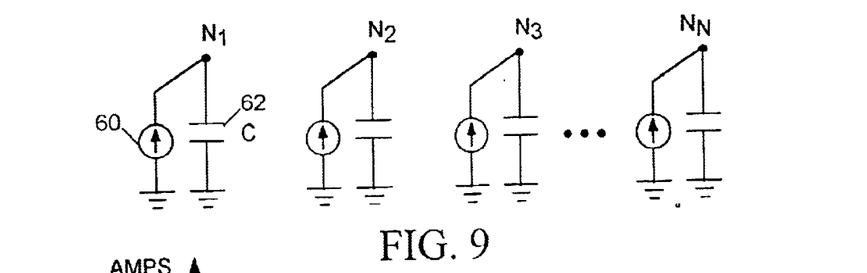
FIG. 9 is a schematic diagram depicting a set of separate aggressor models derived from the aggressor net model of FIG. 7, and employed during the crosstalk estimation process depicted in FIG. 6.
Figure 10:
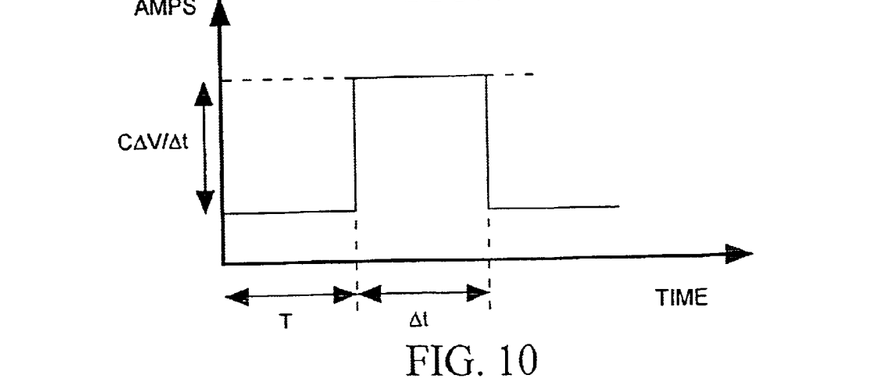
FIG. 10 is a timing diagram illustrating behavior of a current pulse generated by a current source of one of the aggressor models of FIG. 9.

The waveform data depicting signal behavior at each node $N_1$-$N_N$ is then analyzed to develop separate aggressor models as depicted in FIG. 9 for section of the aggressor net that are proximate to a victim net. Each aggressor model includes a current source 60 and a capacitor 62. Capacitor 62 has a capacitance equal to the sum of shunt and coupling capacitance 52 and 56 of the aggressor net section. The current source 60 at each node model produces a current pulse as depicted in FIG. 10. The current pulse has the same delay T as the voltage waveform of FIG. 8 for that aggressor net section, has a pulse width matching the rise time γt of the voltage waveform at that node, and has an amplitude CγVγt. The voltage waveform developed across capacitor 62 in response to the current pulse output of current source 60 therefore approximates the waveform (FIG. 8) produced in the corresponding aggressor net section in response to net input signal $V_A$.

Since the model of FIG. 9 for each aggressive section of an aggressor net can be represented by relatively small amounts of data, and since normally only a relatively small portion of the nets of an IC are aggressors, a conventional computer implementing the method of FIG. 6 can currently store all aggressor models generated at step 45 in a random access memory of reasonable size. This enables the computer to incorporate generated aggressor models generated at step 45 into the crosstalk model developed at step 48 without having to perform disk accesses to obtain the aggressor net models.

Crosstalk Models

Figure 11:
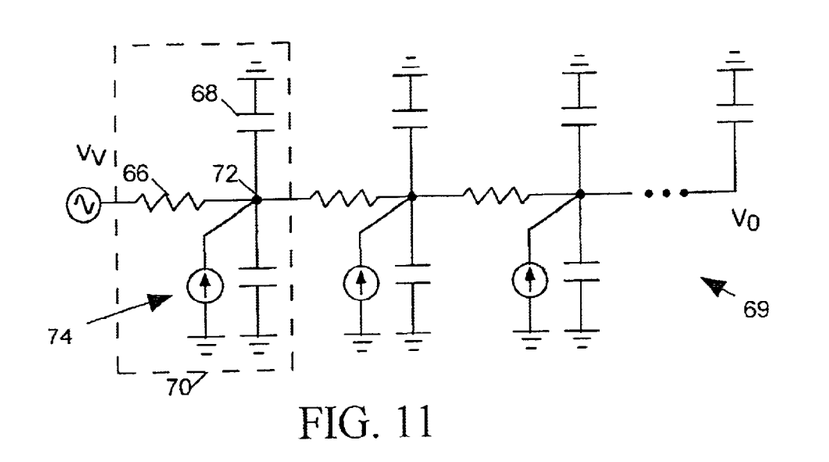
FIG. 11 is a victim net crosstalk model.

FIG. 11 depicts a victim net crosstalk model 69 generated at step 48 of FIG. 6. Crosstalk model 69 includes N sections 70, each corresponding to a separate section of the victim net. Each model section 70 includes a node 72 with a series resistance 66 and shunt capacitance 68 connected to the node representing the series resistance and shunt capacitance of the corresponding section of the net as derived from the RC extraction database. Each model section 70 corresponding to a victim net section that is sufficiently close to an aggressor net also incudes an aggressor model 74 coupled to node 72. The aggressor model 74, generated and stored in memory at step 45 of FIG. 6, represents the contribution of a nearby section of an aggressor net to crosstalk noise in that section of the victim net. Although not shown in FIG. 11, when sections of more than one aggressor net are sufficiently close to a section of the victim net, the crosstalk model 70 corresponding to that section of the victim net will include more than one aggressor net model 74 coupled to node 72.

Figure 12:
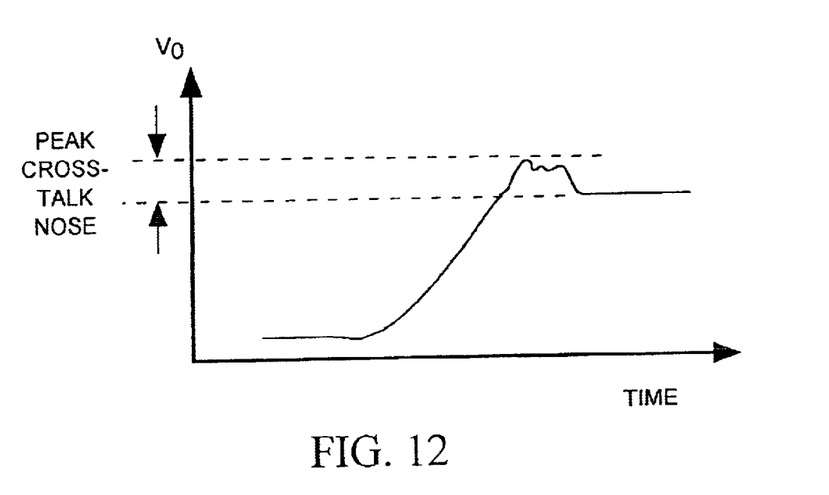
FIG. 12 is a timing diagram illustrating behavior of the output signal of the net of FIG. 11.

During simulation step 49 of FIG. 6, the crosstalk model receives an input signal $V_v$ that transitions between logic states at a predetermined time relative to the reference time 0 as determined by conventional static timing analysis. The simulation of the crosstalk model behavior produces waveform data describing the behavior of the net output signal for example as depicted in FIG. 12. The peak crosstalk noise is estimated by processing waveform data and determining a maximum difference between any peak of the output signal's peak and its steady-state logic level.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

What is claimed is:

1. A method of processing an integrated circuit (IC) layout design describing a victim net of an IC as having a plurality of sections and describing at least one aggressor net of the IC as having a plurality of sections, wherein at least one aggressor net section is proximate to at lest one victim net section, wherein the method estimates peak crosstalk noise in a an output signal of the victim net, the method comprising the steps of:
   a. processing the IC layout design to generate a separate model representing each aggressor net section that is proximate to a section of the victim net;
   b. processing the IC layout design to generate a crosstalk model for the victim net, wherein the crosstalk model includes a separate section corresponding to each victim net section modeling an impedance of its corresponding victim net section, and wherein each crosstalk model section corresponding to a section of the victim net that is proximate to an aggressor net section also includes the model of that aggressor net section generated at step a;
   c. evaluating the crosstalk model to determine a behavior of the output signal in response to an input signal applied as input to the victim net; and
   d. estimating the peak crosstalk noise from the behavior of the output signal determined at step c.

2. The method in accordance with claim 1 wherein the separate model of each aggressor net section comprises a current source and a capacitor.

3. The method in accordance with claim 2 wherein the capacitor of the separate model of each aggressor net section that is proximate to a victim net section represents an estimated coupling capacitance between the aggressor net section and the proximate victim net section.

4. The method in accordance with claim 3 wherein the capacitor also represents an estimated shunt capacitance of the aggressor net section.

5. The method in accordance with claim 1 wherein step a comprises the substeps of:
   a1. generating a separate model of each aggressor net that has at least one section that is proximate to any section of the victim net, wherein each aggressor net section is separately modeled by and estimated series resistance and shunt capacitance of the aggressor net section, and wherein each aggressor net section that is proximate to a victim net section is also modeled by additional shunt capacitance representing an estimated coupling capacitance between that aggressor net section and its proximate victim net section;
   a2. evaluating each aggressor net model generated at step a11 to determine a rate of change and rise time within each section of the aggressor net of an edge of a second input signal conveyed by the aggressor net; and
   a3. generating the separate model representing each aggressor net section that is proximate to a victim net section, the separate model comprising a capacitor and a current source, wherein the current source generates a current pulse of magnitude that is a function of the capacitance of the capacitor and the determined rate of change of the second input signal within that section of the aggressor net, and wherein the current pulse is of duration that is a function of the determined rise time of the second input signal within that section of the aggressor net.

6. A method of processing an integrated circuit (IC) layout design describing a plurality of nets of an IC, each having a plurality of sections to estimate peak crosstalk noise in output signals of the nets, the method comprising the steps of:
   a. processing the IC layout to estimate series resistance and shunt capacitances of said sections of the nets;
   b. processing the IC layout design to identify each net that is an aggressor net having at least one section that is proximate to at least one section of a victim net;
   c. processing the IC layout design to determine for each section of the identiified aggressor net that is proximate to a section of a victim net, a coupling capacitance between that section of the aggressor net and the proximate section of the victim net;
   d. generating a separate aggressor model representing each section of each aggressor net that is proximate to a section of a victim net, the aggressor model being based on the series resistance and shunt capacitance of the aggressor net section estimated at step a and on the coupling capacitance between the aggressor net section and the proximate section of the victim net;
   e. processing the IC layout design to identify each net that is a victim net having at least one section proximate to a section of an aggressor net,
   f. generating a separate crosstalk model for each identified victim net, wherein the crosstalk model includes the estimated series resistance and shunt capacitance of each section of the victim net and incorporating the aggressor model generated at step d of each aggressor net section that is proximate to a section of the identified victim net;
   g. evaluating the crosstalk model for each identified victim net to determine a response of an output signal of that net to a input signal applied as input to the identified victim net; and
   h. estimating peak crosstalk noise in each identified victim net from the response of its output signal determined at step g.

7. Computer-readable media storing software which when read and executed by a computer causes the computer to carry out a method for processing an integrated circuit (IC) layout design describing a victim net of an IC as having a plurality of sections, wherein at least one aggressor net section in proximate to at least one victim net section, wherein the method estimate peak crosswalk noise in an output signal of the victim net, wherein the method comprises the steps of:

a. processing the IC layout design to generate a separate model representing each aggressor net section that is proximate to a section of the victim net;

b. processing the IC layout design to generate a crosstalk model for the victim net, wherein the crosstalk model includes a separate section corresponding to each victim net section, modeling an impedance of its corresponding victim net section, and wherein each crosstalk model section corresponding to a section of the victim net that is proximate to an aggressor net section also includes the model of that aggressor net section generated at step a;

c. evaluating the crosstalk model to determine a behavior of the output signal in response to an input signal applied as input to the victim net; and d. estimating the peak crosstalk noise from the behavior of the output signal determined at step c.

8. The computer readable media in accordance with claim 7 wherein the separate model of each aggressor net section comprises a current source and a capacitor.

9. The computer readable media in accordance with claim 8 wherein the capacitor of the separate model of each aggressor net section that is proximate to a victim net section represents an estimated coupling capacitance between the aggressor net section and the proximate victim net section.

10. The computer readable media in accordance with claim 9 wherein the capacitor also represents an estimated shunt capacitance of the aggressor net section.

11. The computer readable media in accordance with claim 7 wherein step a comprises the substeps of:

a1. generating a separate model of each aggressor net that has at least one section that is proximate to any section of the victim net, wherein each aggressor net section is separately modeled by and estimated series resistance and shunt capacitance of the aggressor net section, and wherein each aggressor net section that is proximate to a victim net section is also modeled by additional shunt capacitance representing an estimated coupling capacitance between that aggressor net section and its proximate victim net section;

a2. evaluating each aggressor net model generated at step a11 to determine a rate of change and rise time within each section of the aggressor net of an edge of a second input signal conveyed by the aggressor net; and a3. generating the separate model representing each aggressor net section that is proximate to a victim net section, the separate model comprising a capacitor and a current source, wherein the current source generates a current pulse of magnitude that is a function of the capacitance of the capacitor and the determined rate of change of the second input signal within that section of the aggressor net, and wherein the current pulse is of duration that is a function of the determined rise time of the second input signal within that section of the aggressor net.

12. Computer-readable media storing software which when read and executed by a computer causes the computer to carry out a method of processing an integrated circuit (IC) layout design describing a plurality of nets of an IC each having a plurality of sections to estimate peak crosstalk noise in output signals of the nets, wherein method comprises the steps of:

a. processing the IC layout to estimate series resistances and shunt capacitances of sections of the nets;

b. processing the IC layout design to identify each net that is an aggressor net having at least one section that is proximate to a section of another net;

c. processing the IC layout design to determine for each aggressor net section that is proximate to a section of a victim net, a coupling capacitance between that section of the aggressor net and the proximate section of said another net;

d. generating a separate aggressor model representing each section of each aggressor net that is proximate to a section of another net, the aggressor model being based on the series resistance and shunt capacitance of the aggressor net section estimated at step a and on the coupling capacitance between the aggressor net section and the proximate section of the victim net;

e. processing the IC layout design to identify each net that is a victim net having at least one section proximate to a section of an aggressor net f. generating a separate crosstalk model for each identified victim net, wherein the crosstalk model includes the estimated series resistance and shunt capacitance of each section of the victim net and incorporating the aggressor model generated at step d of each aggressor net section that is proximate to a section of the identified victim net.

g. evaluating the crosstalk model for each identified victim net to determine a response of an output signal of that net to a input signal applied as input to the identified victim net; and h. estimating the peak crosstalk noise in each identified victim net from the response of its output signal determined at step g.

13. A method for estimating peak crosstalk noise in output signals of nets of an integrated circuit (IC) layout design comprises the steps of:

a. processing the IC layout design to estimate resistances and capacitances of the nets;

b. processing the design to identify each net having at least one section that is proximate to a section of a victim net;

c. generating a separate aggressor model representing each aggressor net section that is proximate to a section of an identified victim net, each separate aggressor model including a current source and a capacitor;

d. processing the design to identify nets having at least one section that is proximate to an aggressor net section as being victim nets;

e. generating a separate crosstalk model for each identified victim net including the victim net's estimated resistances and capacitances and incorporating the aggressor model of each aggressor net section that is proximate to a section of the identified victim net; and f. evaluating the crosstalk model for each identified victim net to determine a behavior of an output signal of that victim net in response to an input signal supplied as input to the victim net.

14. The method in accordance with claim 13 wherein step f further comprises:

estimating the peak crosstalk noise in each identified victim net from the determined behavior of the victim net's output signal.

15. Computer-readable media storing software which when read and executed by a computer causes the computer to carry out a method for estimating peak crosstalk noise in output signals of nets of an integrated circuit (IC) layout design, wherein the method comprises the steps of:

a. processing the IC layout design to estimate resistances and capacitances of the nets;

b. processing the design to identify each net having at least one section that is proximate to a section of a victim net;

c. generating a separate aggressor model representing each aggressor net section that is proximate to a section of an identifeied victim net, each separate aggressor model including a current source and a capacitor;

d. processing the design to identify nets having at least one section that is proximate to an aggressor net section as being victim nets;

e. generating a separate crosstalk model for each identified victim net including the victim net's estimated resistances and capacitances and incorporating the aggressor model of each aggressor net section that is proximate to a section of the identified victim net;

f. evaluating the crosstalk model for each identified victim net to determine a behavior of an output signal of that victim net in response to an input signal supplied as input to the victim net; and g. estimating the peak crosstalk noise in each identified victim net from the determined behavior of the victim net's output signal.

* * * * *